(12) United States Patent
Park

(10) Patent No.: US 7,948,807 B2
(45) Date of Patent: May 24, 2011

(54) SEMICONDUCTOR MEMORY DEVICE HAVING A CURRENT CONSUMPTION REDUCTION IN A DATA WRITE PATH

(75) Inventor: Ki Chon Park, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 595 days.

(21) Appl. No.: 11/964,136

(22) Filed: Dec. 26, 2007

(65) Prior Publication Data

US 2009/0067258 A1    Mar. 12, 2009

(30) Foreign Application Priority Data

Sep. 10, 2007   (KR) .................. 10-2007-0091753

(51) Int. Cl.
*G11C 7/10* (2006.01)
(52) U.S. Cl. ............. 365/189.02; 365/189.17; 365/201
(58) Field of Classification Search ......... 365/189.011, 365/189.02, 189.17, 201
See application file for complete search history.

(56) References Cited

U.S. PATENT DOCUMENTS

| 6,826,101 | B2 * | 11/2004 | Fukuyama ............. 365/201 |
| 6,917,563 | B2 * | 7/2005 | Lindstedt et al. ...... 365/189.02 |
| 7,095,652 | B2 * | 8/2006 | Higashi et al. ......... 365/185.13 |

FOREIGN PATENT DOCUMENTS

| KR | 1019960012401 A | 4/1996 |
| KR | 1020060076579 A | 7/2006 |

* cited by examiner

*Primary Examiner* — VanThu Nguyen
(74) *Attorney, Agent, or Firm* — Ladas & Parry LLP

(57) ABSTRACT

The present invention describes a semiconductor memory device that can reduce current consumption occurring in a data write path. The semiconductor memory device includes a write path over which any one of general data and representative data corresponding to a particular mode is transferred in correspondence with a prescribed pad. A routing controller allows the representative data to be routed over a transfer path corresponding to any other pads in the particular mode and prevents the general data from being routed over the transfer path in modes other than the particular mode. The semiconductor memory device can reduce current consumption caused by unnecessary toggling of the data through utilization of the routing controller.

10 Claims, 4 Drawing Sheets

SEMICONDUCTOR MEMORY DEVICE HAVING A CURRENT CONSUMPTION REDUCTION IN A DATA WRITE PATH

CROSS-REFERENCE TO RELATED APPLICATIONS

The present application claims priority to Korean patent application number 10-2007-0091753 filed on Sep. 10, 2007, which is incorporated herein by reference in its entirety.

BACKGROUND OF THE INVENTION

The present invention relates to a semiconductor memory device, and more precisely to a semiconductor memory device that can reduce current consumption occurring in a data write path.

In general, when determining whether or not cells of a semiconductor memory device such as DRAM have a defect, testing all of the memory cells one-by-one requires a lot of time to individually test each cell as well as having a large cost associated with such a process.

Therefore, a general semiconductor memory device is developed to support a parallel test mode to reduce test time and cost. The parallel test mode determines a pass if all data is equally output in the read operation after writing the same data to multiple cells and determines a failure if any data is output differently. This process significantly reduces test time.

cells and determines a failure if any data is output differently. This process significantly reduces test time.

In the parallel test mode as mentioned, the data transfer is conventionally performed over a write path, which is a data transfer path in the write operation, as shown in FIG. 1.

Referring to FIG. 1, when in a normal mode, general data input to pads DQ0~DQ3, respectively, are buffered via input buffers 10a~10d and aligned in order of the burst sequence by a write data strobe signal WDQS via a data aligning unit 11a~11d.

The general aligned data ALGN_DATA0~ALGN_DATA3 are amplified via input/output sense amplifying units 13a~13d and transferred into corresponding memory cells through global input/output lines WGIO0~WGIO3.

Meanwhile, the representative data input from a representative pad DQ0 among a plurality of pads DQ0~DQ3 is aligned via the input buffer 10a and the data aligning unit 11a in the parallel test mode.

The representative data aligned by the data aligning unit 11a is routed into multiplexers 12b~12d. The representative data ALGN_DATA0, which is aligned by the multiplexers 12b~12d, is output to the input/output sense amplifying units 13a~13d respectively when the parallel test signal PARA_TEST is enabled.

More specifically, only the representative data input from the representative pad DQ0 among the multiple pads DQ0~DQ3, is used in order to write the same data to a plurality of memory cells in the parallel test mode.

As such, the prior art uses the multiplexers 12b~12d controlled by the parallel test signal PARA_TEST in order to select and transfer only one of the data signals, e.g., ALGN_DATA0 and ALGN_DATA1, which are aligned in accordance with the normal mode and the parallel test mode.

However, unnecessary current consumption occurs during the transfer of the general aligned data ALGN_DATA0, since the general data ALGN_DATA0 that is aligned by the data aligning unit 11a is also routed into the multiplexers 12b~12d in the write operation besides the parallel test mode.

Further, a semiconductor memory device, such as DDR2 SDRAM, generally includes an off-chip driver (OCD) controller 14 to control an impedance of a data output driver. To control the off-chip driver means to control an impedance of the data output driver at an optimal level in the present system by measuring voltage or current that flows in the data output driver of the memory device interfacing the data with external devices.

In order to control such an off-chip driver, a prior art semiconductor memory device is input with the representative data from the pad DQ0 for use in controlling the impedance of the data output driver in a standby mode (IDLE). A prior art semiconductor memory device also aligns the representative data via the data aligning unit 11a and then transfers the representative data to the off-chip driver controller 14. The off-chip driver controller 14 then outputs a signal OCD_OUT for use in controlling the impedance of the data output driver using the representative aligned data ALGN_DATA0.

However, unnecessary current consumption occurs during the transfer of the aligned data ALGN_DATA0 since the general data ALGN_DATA0 aligned via the data aligning unit 11a is routed into the off-chip driver controller 14 in the write operation besides the standby mode.

As such, since the general aligned data ALGN_DATA0 is also routed over other transfer paths in the write operation, the general aligned data ALGN_DATA0 is toggled unnecessarily leading to unnecessary current consumption. Such unnecessary current consumption results in increased operating burst write current (IDD4W) consumption of the semiconductor memory device.

SUMMARY OF THE INVENTION

The present invention provides a semiconductor memory device with reduced operating burst write current consumption.

The present invention provides a semiconductor memory device which can reduce unnecessary current consumption caused when a prescribed data is routed via any other transfer path for a parallel test mode in a write operation.

The present invention provides a semiconductor memory device which can reduce unnecessary current consumption caused when a prescribed data is routed over any other transfer path for the purpose of controlling an impedance of a data output driver in a write operation.

In order to achieve the object mentioned-above, the semiconductor memory device according to one aspect of the present invention comprises a write path for transferring a general data corresponding to a first mode or a representative data corresponding to a second mode from a first pad; and a routing controller which allows the representative data to be routed over a transfer path corresponding to second pads in the second mode and prevents the general data from being routed over the transfer path in cases other than the second mode.

Preferably, the general data is input in a write operation and the representative data is representatively input in a parallel test mode or a standby mode.

Further preferably, the routing control unit allows the representative data to be routed over the transfer path in the parallel test mode and prevents the general data from being routed over the transfer path in the write operation.

Still further preferably, the transfer path further comprises an off-chip driver controller which is input with the representative data to control an impedance of the data output driver in the standby mode.

Still further preferably, the routing control unit allows the representative data to be routed into the off-chip driver controller in the standby mode and prevents the general data from being routed into the off-chip driver controller in the write operation.

A semiconductor memory device according to another aspect of the present invention to achieve the object mentioned-above comprises a plurality of first pads to which a first general data is input respectively; a second pad to which any one of a second general data and a representative data corresponding to a second mode is input; data aligning units which align the data input of the first pads and the second pad in a burst sequence order; a routing controller which allows the representative aligned data to be routed over a transfer path corresponding to the first pads and the second pad in the second mode and prevents the second general aligned data from being routed over a transfer path corresponding to the first pads in cases other than the second mode; a plurality of multiplexers which select and transfer any one of the first general aligned data or the representative aligned data in accordance with the mode; and a plurality of input/output sense amplifying units that amplify the second general aligned data and the data transferred by the multiplexer and transfers them to a global input/output line.

Preferably, the first general data and the second general data are input to the first pads and the second pad respectively in the write operation and the representative data is input representatively to the second pad in the parallel test mode or the standby mode.

Further preferably, the routing controller allows the representative aligned data to be transferred to each of the multiplexers in the parallel test mode and prevents the second general aligned data from being transferred to each of the multiplexers in the write operation.

Still further preferably, the routing controller logically combines a parallel test signal that determines the parallel test mode with the representative aligned data or the second general data so that the representative aligned data or the second general data are transferred to the each multiplexer when the parallel test signal is enabled.

In addition, the semiconductor memory device of the present invention further comprises an off-chip driver controller that is input with the representative aligned data to control an impedance of the data output driver in the standby mode.

Preferably, the routing controller allows the representative aligned data to be transferred to the off-chip driver controller in the standby mode and prevents the second general aligned data from being transferred to the off-chip driver controller in the write operation.

Further preferably, the routing controller logically combines an RAS idle signal that determines the standby mode with the representative aligned data or the second general data so that the representative aligned data or the second general data are transferred to the off-chip driver controller when the RAS idle signal is enabled.

Still further preferably, the routing controller prevents the second general aligned data from being transferred to the multiplexer and the off-chip driver controller in the write operation, allows the representative aligned data to be transferred to each multiplexer in the parallel test mode, and transfers the representative aligned data to the off-chip driver controller in the standby mode.

Still further preferably, the routing controller comprises a first logical combiner which logically combines a parallel test signal determining the parallel test mode with an RAS idle signal that determines the standby mode to output an output signal of an enable state when at least one of the parallel test signal and the RAS idle signal is enabled; and a second logical combiner which logically combines an output signal from the first logical combiner with the representative aligned data or the second general aligned data to transfer the representative aligned data or the second general aligned data to each multiplexer and the off-chip driver controller when the output signal is enabled.

Still further preferably, the multiplexer selects and transfers the first general aligned data when in the write operation and the representative aligned data which is routed over the transfer path when in the parallel test mode or the standby mode.

The present invention can reduce current consumption and thus reduce operating burst write current consumption by preventing a prescribed data from being routed over any other transfer path except for corresponding write path in the write operation.

Further, the present invention can reduce unnecessary toggling of the data and thus reduce current consumption by preventing a prescribed data from being routed via any other write path for a parallel test mode in a write operation.

Furthermore, the present invention can reduce unnecessary toggling of the data and thus reduce current consumption by preventing a prescribed data from being routed into an off-chip driver controller for the purpose of controlling an impedance of the data output driver in a write operation.

DESCRIPTION OF PARTICULAR EMBODIMENTS

Hereinafter, preferred embodiments of the present invention will be described in detail with reference to the accompanying drawings.

The present invention provides a semiconductor memory device that can prevent prescribed data from being routed over any other transfer paths corresponding to a particular mode in a write operation to reduce current consumption caused by the unnecessary toggling of the data.

Figure 1:
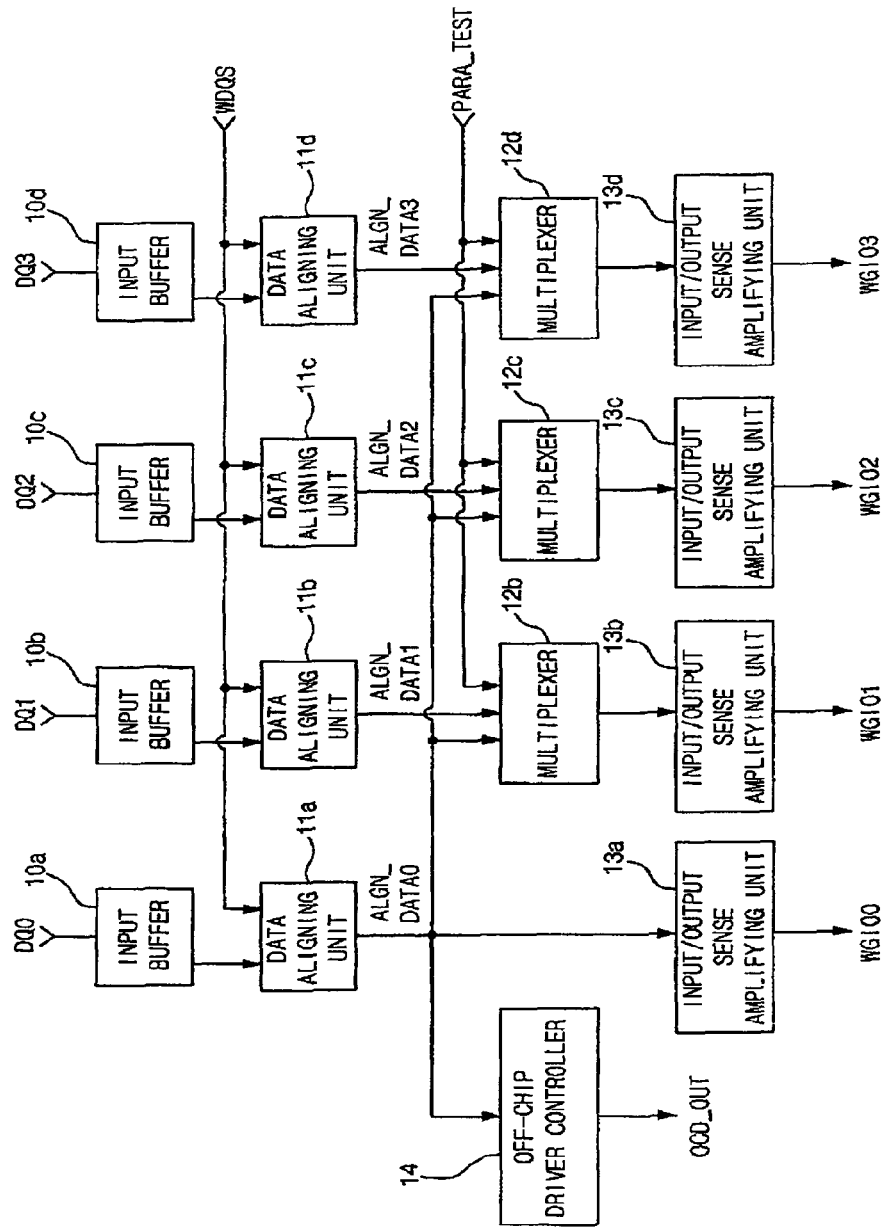
FIG. 1 is a block diagram illustrating one portion of a data write path of a semiconductor memory device according to the prior art.
Figure 2:
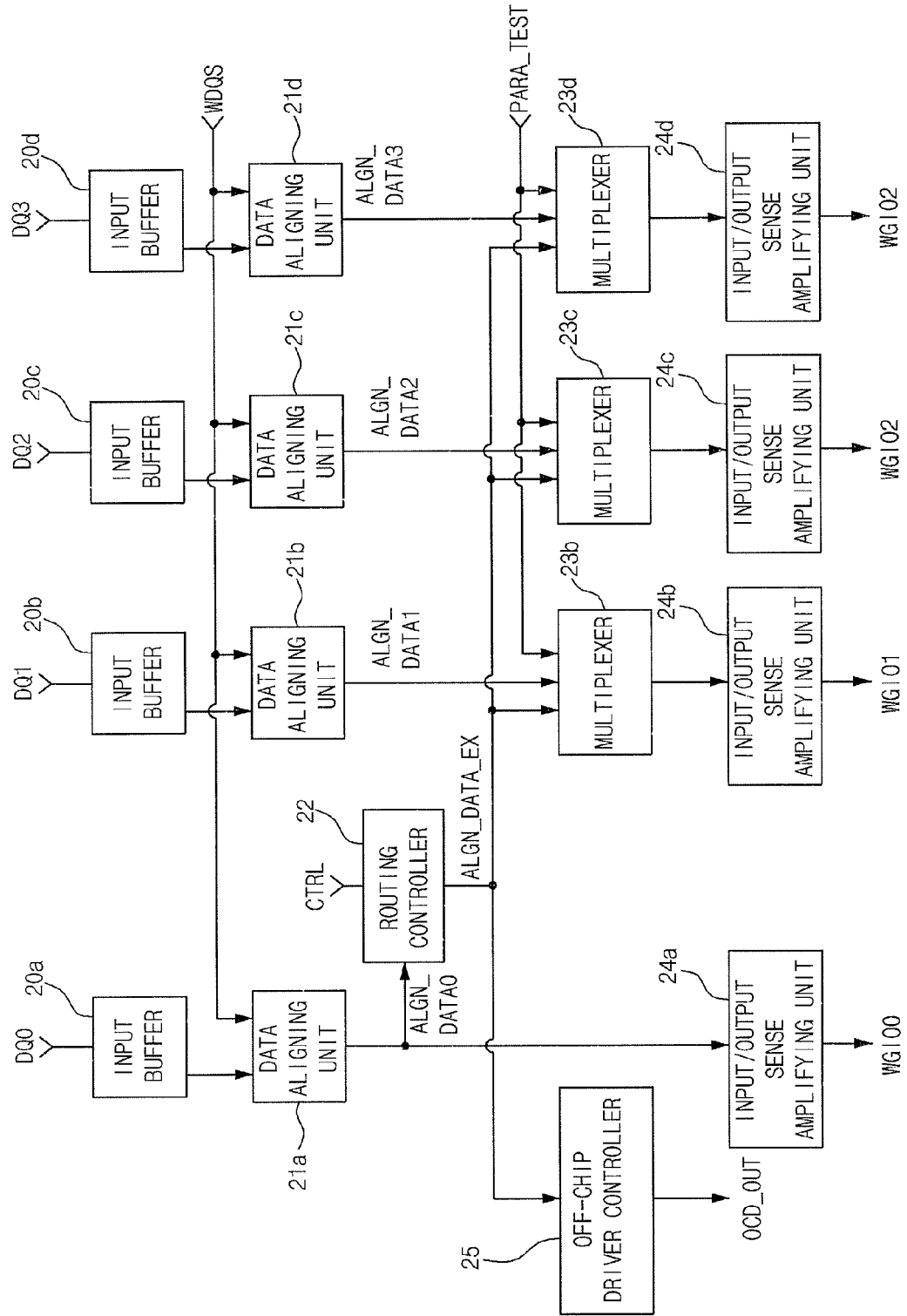
FIG. 2 is a block diagram illustrating one portion of a data write path of a semiconductor memory device according to the present invention.

More specifically, as shown in FIG. 2, the semiconductor memory device according to the present invention includes a plurality of input buffers 20a~20d, a plurality of data aligning units 21a~21d, a routing controller 22, a plurality of multiplexers 23b~23d, and a plurality of input/output sense amplifying unit 24a~24d.

Each of the input buffers 20a~20d buffers the data input from each pad DQ0~DQ3 and outputs the buffered input data input.

Each of the data aligning units 21a~21d aligns the data buffered by the input buffers 20a~20d in a burst sequence order and outputs it as the aligned data ALGN_DATA0~ALGN_DATA3.

The routing controller 22 allows a representative aligned data ALGN_DATA0 corresponding to a particular mode to be routed over a transfer path corresponding to any other pad DQ1~DQ3 and prevents the general aligned data ALGN_DATA0 from being routed over the transfer path in a mode other than the particular mode selected.

Herein, the routing controller 22 is input and controlled with a control signal CTRL corresponding to a particular mode. A parallel test signal PARA_TEST can be used as a control signal CTRL if the particular mode is a parallel test mode. Further, the representative aligned data ALGN_DATA0 means that the data input from one pad DQ0 is aligned in the particular mode. The general aligned data ALGN_DATA0 means that the data input from the pad DQ0 is aligned in the normal mode.

Each of the multiplexers 23b~23d selects and transfers any one of aligned data ALGN_DATA_EX routed by the routing controller 22 and the aligned data ALGN_DATA1~ALGN_DATA3 in accordance with a state of a parallel test signal PARA_TEST.

Each of the input/output sense amplifying units 24a~24d amplifies the aligned data ALGN_DATA_EX or the aligned data ALGN_DATA_EX, ALGN_DATA1~ALGN_DATA3 and transfers them to the global input/output lines WGIO0~WGIO3.

Figure 3:
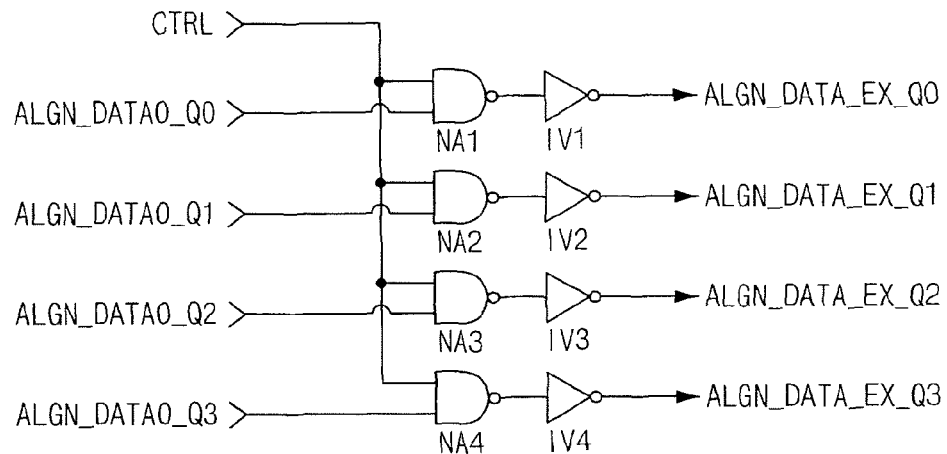
FIG. 3 is a circuit diagram illustrating one example of the routing controller 22 of FIG. 2.

The semiconductor memory device having a structure in accordance with an embodiment of the present invention can prevent the general aligned data ALGN_DATA_EX from being transferred to each multiplexer 23b~23d via the routing controller 22 in the write operation. The routing controller 22 may be structured as shown in FIG. 3. In FIG. 3, it is considered that 4-bit data is sequentially input from each of the data input/output pads DQ0~DQ3 so that the aligned data ALGN_DATA0 corresponds to ALGN_DATA_Q0~ALGN_DATA0_Q3.

Referring to FIG. 3, the routing controller 22 includes a logical combiner that logically combines the control signal CTRL with the aligned data ALGN_DATA_Q0~ALGN_DATA0_Q3, respectively. The logical combiner includes NAND gates NA1~NA4 and inverters IV1~IV4 where the NAND gate NA1 performs a NAND logical operation (i.e., "NAND-combines") for logically combining the control signal CTRL with the aligned data ALGN_DATA0_Q0 and the inverter IV1 inverts an output from the NAND gate NA1 to output it as the aligned data ALGN_DATA_EX_Q0. the NAND gate NA2 NAND-combines the control signal CTRL with the aligned data ALGN_DATA0_Q1 and the inverter IV2 inverts an output from the NAND gate NA2 to output it as the aligned data ALGN_DATA_EX_Q1. The NAND gate NA3 NAND-combines the control signal CTRL with the aligned data ALGN_DATA0_Q2 and The inverter IV3 inverts an output from the NAND gate NA3 to output it as the aligned data ALGN_DATA_EX_Q2. The NAND gate NA4 NAND-combines the control signal CTRL with the aligned data ALGN_DATA0_Q3 and The inverter IV4 inverts an output from the NAND gate NA4 to output it as the aligned data ALGN_DATA_EX_Q3.

Meanwhile, the semiconductor memory device according to an embodiment of the present invention further comprises an off-chip driver controller 25 that receives the representative aligned data ALGN_DATA_EX and outputs the signal OCD_OUT for use in controlling the impedance of the data output driver in standby mode.

In one example, an RAS idle signal RAS_IDLE corresponding to the standby mode can be used as the control signal CTRL. The routing controller 22 prevents the general aligned data ALGN_DATA_EX from being transferred to the off-chip driver controller 25 in the write mode.

In another example, the parallel test signal PARA_TEST and RAS idle signal RAS_IDLE can be used as the control signal CTRL. The routing controller 22 prevents the general aligned data ALGN_DATA_EX from being transferred to each of the multiplexers 23b~23d and the off-chip driver controller 25 in the write operation.

In such a write operation, the routing controller 22 prevents the aligned data ALGN_DATA_EX from being transferred to each multiplexer 23b~23d. The off-chip driver controller 25 is structured as shown in FIG. 4.

Figure 4:
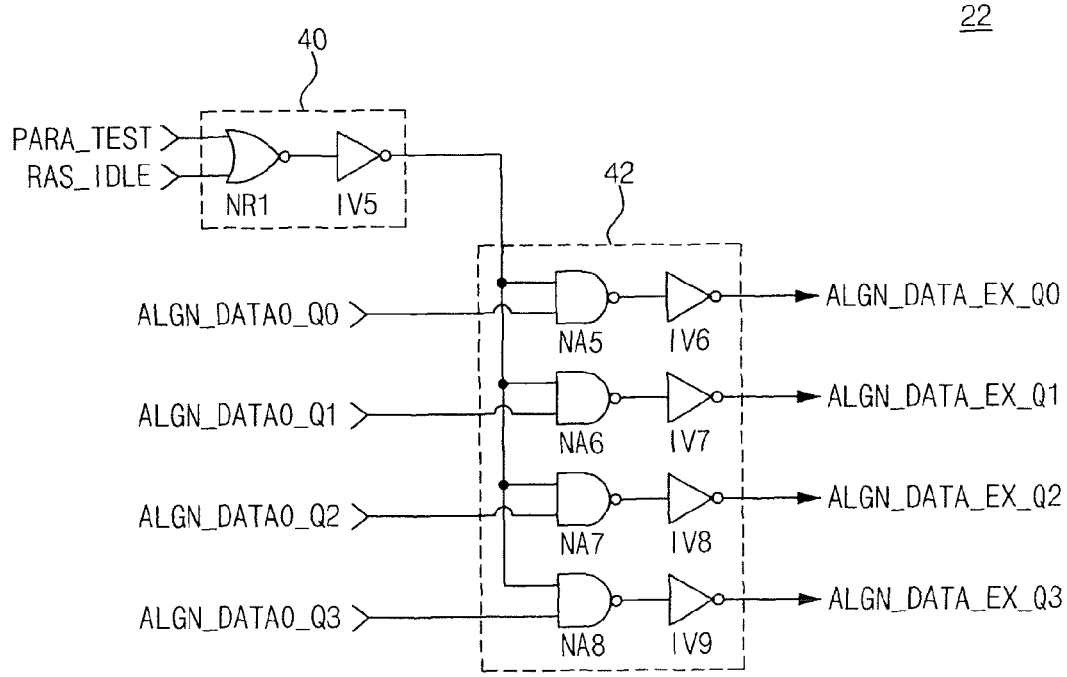
FIG. 4 is a circuit diagram illustrating another example of the routing controller 22 of FIG. 2.

Referring to FIG. 4, the routing controller 22 includes two logical combiners 40, 42. The logical combiner 40 includes a NOR gate NR1 which NOR-combines the parallel test signal PARA_TEST with the RAS idle signal RAS_IDLE and an inverter IV5 that inverts an output from the NOR gate NR1. The logical combiner 42 includes NAND gates NA5~NA8 and inverters IV6~IV9 where The NAND gate NA5 which NAND-combines an output from the inverter IV5 with the aligned data ALGN_DATA0_Q0 and the inverter IV6 inverts an output from the NAND gate NA5 and outputs it as the aligned data ALGN_DATA_EX_Q0. The NAND gate NA6 which NAND-combines an output from the inverter IV5 with the aligned data ALGN_DATA0_Q1 and the inverter IV7 inverts an output from the NAND gate NA6 and outputs it as the aligned data ALGN_DATA_EX_Q1. The NAND gate NA7 NAND-combines an output from the inverter IV5 with the aligned data ALGN_DATA0_Q2 and the inverter IV8 which inverts an output from the NAND gate NA7 and outputs it as the aligned data ALGN_DATA_EX_Q2. The NAND gate NA8 NAND-combines an output from the inverter IV5 with the aligned data ALGN_DATA0_Q3 and the inverter IV9 inverts an output from the NAND gate NA8 and outputs it as the aligned data ALGN_DATA_EX_Q3.

Figure 5:
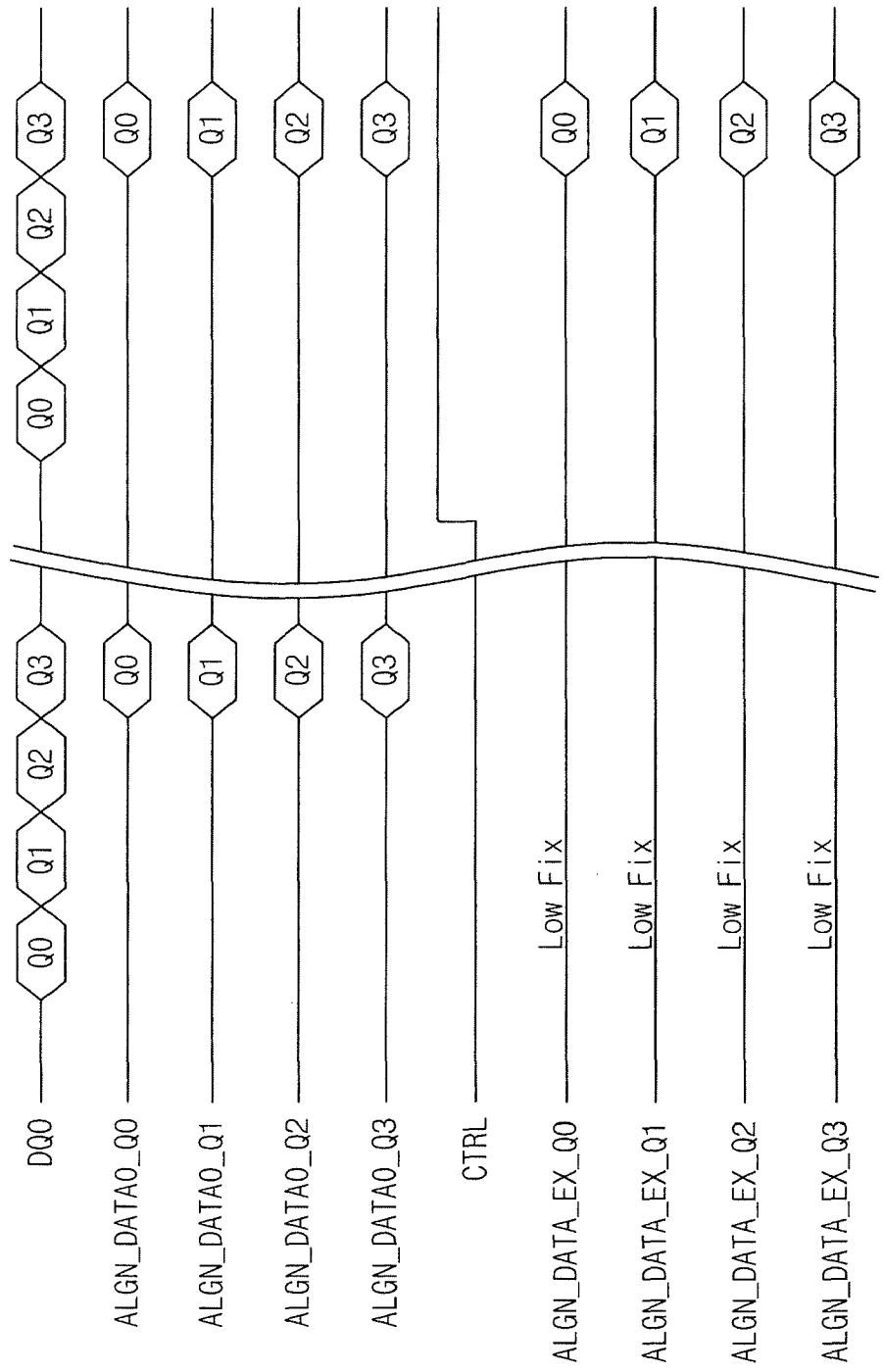
FIG. 5 is a wave-form diagram illustrating data transfer corresponding to an operating mode of the semiconductor memory device according to the present invention.

Hereinafter, operations of the semiconductor memory device according to the present invention will be described referring to FIG. 5.

First, in the write mode, i.e., when the control signal CTRL is at a low level, the general data Q0~Q3 which is sequentially input from the data input/output pad DQ0 is aligned as ALGN_DATA0_Q0~ALGN_DATA0_Q3 via the data aligning unit 21a and the general aligned data ALGN_DATA0_Q0~ALGN_DATA0_Q3 is fixed at a low level via the routing controller 22.

That is, the general aligned data ALGN_DATA0_Q0~ALGN_DATA0_Q3 are not routed to the multiplexers 23b~23d or the off-chip driver controller 25 via the routing controller 22 in the write operation.

When in the parallel test mode, i.e., when the control signal CTRL is at a high level, the representative aligned data ALGN_DATA0_Q0~ALGN_DATA0_Q3 is output to the representative aligned data ALGN_DATA_EX_Q0~ALGN_DATA_EX_Q3 via the routing controller 22 and the representative aligned data ALGN_DATA_EX_Q0~ALGN_DATA_EX_Q3 is transferred to the input/output sense amplifying units 24b~24d via the multiplexers 23b~23d.

Further, when in the standby mode, i.e., when the control signal CTRL is at a high level, the representative aligned data ALGN_DATA0_Q0~ALGN_DATA0_Q3 is output as the representative aligned data ALGN_DATA_EX_Q0~ALGN_DATA_EX_Q3 via the routing controller 22 and the representative aligned data ALGN_DATA_EX_Q0~ALGN_DATA_EX_Q3 is input to the off-chip driver controller 25.

As mentioned above, the semiconductor memory device prevents a prescribed data from being routed over other transfer paths for the particular mode in the write operation.

For example, the representative aligned data ALGN_DATA0 that is input to a prescribed pad DQ0 and aligned via the data aligning unit 11a is allowed to be routed into each multiplexer 23b~23d via the routing controller 22 when in the parallel test mode. However, the general aligned data ALGN_DATA0 that is input to the same pad DQ0 and aligned via the data aligning unit 11a is prevented from being routed into each multiplexer 23b~23d via the routing controller 22 when in the write mode.

More specifically, it is possible to reduce unnecessary toggling of the aligned data ALGN_DATA0 in the write operation to reduce current consumption since the general aligned data ALGN_DATA0 is prevented from being routed over any other write path for the parallel test mode during the write operation.

Further, the representative aligned data ALGN_DATA0 is allowed to transfer to the off-chip driver controller 25 in the standby mode. However, the general aligned data ALGN_DATA0 is prevented from being transferred via the routing controller 22 in the write operation.

That is, it is possible to reduce unnecessary toggling of the aligned data ALGN_DATA0 in the write operation and reduce current consumption since the general aligned data ALGN_DATA0 is not transferred to the circuit for use in controlling the impedance of the data output driver.

According to an embodiment of the present invention, it is possible to reduce operation burst write current consumption since the semiconductor memory device can reduce current consumption caused by the aligned data ALGN_DATA0 in the write operation.

Those skilled in the art will appreciate that the particular embodiments disclosed in the foregoing description may be readily utilized as a basis for modifying or designing another embodiment for carrying out the same purposes of the present invention. Those skilled in the art will also appreciate that such equivalent embodiments do not depart from the spirit and scope of the invention as set forth in the appended claims.

What is claimed is:

1. A semiconductor memory device, comprising:
a plurality of first pads to which a first general data is input respectively;
a second pad to which any one of a second general data and a representative data corresponding to a second mode is input;
data aligning units which align the data input of the first pads and the second pad in a burst sequence order;
a routing controller which allows the representative aligned data to be routed over a transfer path corresponding to the first pads and the second pad in the second mode and prevents the second general aligned data from being routed over a transfer path corresponding to the first pads in cases other than the second mode;
a plurality of multiplexers which select and transfer any one of the first general aligned data or the representative aligned data in accordance with the mode; and
a plurality of input/output sense amplifying units that amplify the second general aligned data and the data transferred by the multiplexer and transfers them to a global input/output line.

2. The semiconductor memory device as set forth in claim 1, wherein the first general data and the second general data are input to the first pads and the second pad respectively in the write operation, and the representative data is input representatively to the second pad in the parallel test mode or the standby mode.

3. The semiconductor memory device as set forth in claim 2, wherein the routing controller allows the representative aligned data to be transferred to each of the multiplexers in the parallel test mode and prevents the second general aligned data from being transferred to each of the multiplexers in the write operation.

4. The semiconductor memory device as set forth in claim 3, wherein the routing controller logically combines a parallel test signal that determines the parallel test mode with the representative aligned data or the second general data so that the representative aligned data or the second general data are transferred to each multiplexer when the parallel test signal is enabled.

5. The semiconductor memory device as set forth in claim 2, further comprising an off-chip driver controller that is input with the representative aligned data to control an impedance of the data output driver in the standby mode.

6. The semiconductor memory device as set forth in claim 5, wherein the routing controller allows the representative aligned data to be transferred to the off-chip driver controller in the standby mode and prevents the second general aligned data from being transferred to the off-chip driver controller in the write operation.

7. The semiconductor memory device as set forth in claim 6, wherein the routing controller logically combines an RAS idle signal that determines the standby mode with the representative aligned data or the second general data so that the representative aligned data or the second general data are transferred to the off-chip driver controller when the RAS idle signal is enabled.

8. The semiconductor memory device as set forth in claim 6, wherein the routing controller prevents the second general aligned data from being transferred to the multiplexer and the off-chip driver controller in the write operation, allows the representative aligned data to be transferred to each multiplexer in the parallel test mode, and transfers the representative aligned data to the off-chip driver controller in the standby mode.

9. The semiconductor memory device as set forth in claim 8, wherein the routing controller comprises:
a first logical combiner which logically combines a parallel test signal determining the parallel test mode with an RAS idle signal that determines the standby mode to output an output signal of an enable state when at least one of the parallel test signal and the RAS idle signal is enabled; and
a second logical combiner which logically combines an output signal from the first logical combiner with the representative aligned data or the second general aligned data to transfer the representative aligned data or the second general aligned data to each multiplexer and the off-chip driver controller when the output signal is enabled.

10. The semiconductor memory device as set forth in claim 1, wherein the multiplexer selects and transfers the first general aligned data when in the write operation and the representative aligned data which is routed over the transfer path when in the parallel test mode or the standby mode.

* * * * *